（12）United States Patent
Ricci et al.

(10) Patent No.: US 9,618,185 B2
(45) Date of Patent: Apr. 11, 2017

(54) LED ARRAY FOR REPLACING FLOURESCENT TUBES

(75) Inventors: Christopher P. Ricci, Saratoga, CA (US); Gary Fong, Cupertino, CA (US)

(73) Assignee: Flextronics AP, LLC, Broomfield, CO (US)

( * ) Notice: Subject to any disclaimer, the term of this patent is extended or adjusted under 35 U.S.C. 154(b) by 105 days.

(21) Appl. No.: 13/415,583

(22) Filed: Mar. 8, 2012

(65) Prior Publication Data

US 2013/0235573 A1    Sep. 12, 2013

(51) Int. Cl.

| | |
|---|---|
| *F21V 17/00* | (2006.01) |
| *F21V 9/06* | (2006.01) |
| *F21V 21/14* | (2006.01) |
| H05K 1/18 | (2006.01) |
| *F21V 29/70* | (2015.01) |
| *F21K 9/27* | (2016.01) |
| *F21Y 101/00* | (2016.01) |
| *F21Y 105/10* | (2016.01) |
| *F21Y 115/10* | (2016.01) |

(52) U.S. Cl.
CPC .................. *F21V 9/06* (2013.01); *F21K 9/27* (2016.08); *F21V 21/14* (2013.01); *F21V 29/70* (2015.01); *H05K 1/181* (2013.01); *F21Y 2101/00* (2013.01); *F21Y 2105/10* (2016.08); *F21Y 2115/10* (2016.08); *H01L 2224/16225* (2013.01); *H01L 2224/48091* (2013.01); *H01L 2224/48227* (2013.01); *H05K 2201/09072* (2013.01); *H05K 2201/10106* (2013.01); *Y02P 70/611* (2015.11); *Y10T 29/4913* (2015.01)

(58) Field of Classification Search
CPC ........... F21Y 2103/003; F21Y 2103/00; F21Y 2113/005; F21K 9/10; F21K 9/1355; F21V 9/06; F21V 29/70

USPC ................. 362/217.01–217.02, 221–223
See application file for complete search history.

(56) References Cited

U.S. PATENT DOCUMENTS

| | | |
|---|---|---|
| 4,771,824 A | 9/1988 | Rojey et al. |
| 5,890,794 A | 4/1999 | Abtahi et al. |
| 5,904,415 A * | 5/1999 | Robertson ............. F21V 19/008 362/217.16 |
| RE36,414 E | 11/1999 | Tickner |

(Continued)

FOREIGN PATENT DOCUMENTS

JP    2011025578 A    2/2011

OTHER PUBLICATIONS

Office Action dated Dec. 27, 2012, U.S. Appl. No. 12/252,881, filed Oct. 16, 2008, Applicant: Mark R. Callegari, 12 pages.

*Primary Examiner* — Diane Lee
*Assistant Examiner* — Gerald J Sufleta, II
(74) *Attorney, Agent, or Firm* — Haverstock & Owens LLP (57) ABSTRACT

An LED lighting assembly is provided as a drop-in replacement for standard flourescent tubes. An LED lighting assembly and corresponding method for its assembly comprises a substrate having an LED array mounted thereon. The LED array can be mounted in traditional wirebonded or flip chip arrangements. The assembly further includes a heat sink layer, a light diffusion layer, a UV filter layer, and a structural frame for supporting the assembly. The structural frame can be adjusted to replace any length flourescent tube. A voltage controller is provided to filter out voltage spikes from a power source. A microcontroller is provided for receiving any control instructions.

15 Claims, 4 Drawing Sheets

(56) References Cited

U.S. PATENT DOCUMENTS

| | | | |
|---|---|---|---|
| 6,882,111 B2* | 4/2005 | Kan et al. | 315/122 |
| 7,210,832 B2 | 5/2007 | Huang | |
| 7,455,444 B2 | 11/2008 | Chien | |
| 7,674,025 B2 | 3/2010 | Liesener | |
| 7,682,853 B2 | 3/2010 | Ashida | |
| 7,938,558 B2 | 5/2011 | Wilcox et al. | |
| 8,016,451 B2 | 9/2011 | Householder | |
| 8,128,260 B2 | 3/2012 | Ariyoshi | |
| 8,227,969 B2 | 7/2012 | Yamaguchi et al. | |
| 8,228,261 B2 | 7/2012 | Callegari | |
| 8,231,254 B2 | 7/2012 | Beck et al. | |
| 8,272,759 B2 | 9/2012 | Chou | |
| 8,378,559 B2 | 2/2013 | Shuja et al. | |
| 8,591,051 B2 | 11/2013 | Nakajima | |
| 8,696,951 B2 | 4/2014 | Takase et al. | |
| 2004/0189218 A1* | 9/2004 | Leong et al. | 315/291 |
| 2005/0007769 A1* | 1/2005 | Bonzer et al. | 362/157 |
| 2007/0028626 A1 | 2/2007 | Chen | |
| 2008/0112176 A1 | 5/2008 | Liesener | |
| 2011/0063836 A1 | 3/2011 | Salm | |
| 2011/0215348 A1* | 9/2011 | Trottier | F21V 9/08 257/89 |
| 2011/0228517 A1* | 9/2011 | Kawabat et al. | 362/84 |
| 2012/0019137 A1* | 1/2012 | Safarikas et al. | 315/35 |
| 2012/0120667 A1 | 5/2012 | Schenkl | |
| 2012/0218746 A1* | 8/2012 | Winton | 362/219 |
| 2013/0027906 A1 | 1/2013 | Ueda et al. | |
| 2013/0050998 A1* | 2/2013 | Chu et al. | 362/218 |
| 2013/0051001 A1* | 2/2013 | Miskin | 362/227 |
| 2013/0135866 A1* | 5/2013 | Souvay et al. | 362/249.02 |
| 2013/0182425 A1* | 7/2013 | Seki et al. | 362/217.05 |
| 2014/0001496 A1 | 1/2014 | Musser et al. | |
| 2014/0003053 A1 | 1/2014 | Musser et al. | |
| 2015/0016123 A1 | 1/2015 | Musser et al. | |

\* cited by examiner

LED ARRAY FOR REPLACING FLOURESCENT TUBES

FIELD OF THE INVENTION

The present invention relates to the field of lighting arrays. More specifically, the present invention relates to the field of LED lighting arrays for drop-in replacement of flourescent tubes.

BACKGROUND OF THE INVENTION

Flourescent lamps are a well known and cost effective means for providing light in both commercial and residential environments. Flourescent lamps are readily available in many sizes. However, flourescent lamps suffer from many inherent drawbacks. For example, fluorescent lamps are negative differential resistance devices, so as more current flows through them, the electrical resistance of the fluorescent lamp drops, allowing even more current to flow. Connected directly to a constant-voltage power supply, a fluorescent lamp would rapidly self-destruct due to the uncontrolled current flow. To prevent this, fluorescent lamps must use an auxiliary device, a ballast, to regulate the current flow through the tube. The simplest ballast for alternating current use is an inductor placed in series, generally having a winding on a laminated magnetic core. The inductance of this winding limits the flow of AC current. This type is still used, for example, in 120 volt operated desk lamps using relatively short lamps. Ballasts are rated for the size of lamp and power frequency. Where the mains voltage is insufficient to start long fluorescent lamps, the ballast is often a step-up autotransformer with substantial leakage inductance (so as to limit the current flow). Either form of inductive ballast may also include a capacitor for power factor correction. It follows naturally that ballasts are expensive items that must be replaced intermittently. Also, the light output and performance of fluorescent lamps is critically affected by the temperature of the bulb wall and its effect on the partial pressure of mercury vapor within the lamp. Each lamp contains a small amount of mercury which must vaporize to support the lamp current and generate light. At low temperatures the mercury is in the form of dispersed liquid droplets. As the lamp warms, more of the mercury is in vapor form. At higher temperatures, self-absorption in the vapor reduces the yield of UV and visible light. Since mercury condenses at the coolest spot in the lamp, careful design is required to maintain that spot at the optimum temperature, around 40° C. It again follows naturally that special steps should be taken for the disposal of flourescent tubes, since they cause mercury to leak into landfills and thereby cause contamination.

A light-emitting diode (LED) is a semiconductor-based light source. Many different semiconductors, such as silicon, gallium arsenide, copper indium gallium selenide, or others can be used in their manufacture. When a light-emitting diode is forward biased (switched on), electrons are able to recombine with electron holes within the device, releasing energy in the form of photons. This effect is called electroluminescence. The color of the light, corresponding to the energy of the photon, is determined by the energy gap of the particular semiconductor substrate used. LEDs are often small in area, approximately 2 mm squared, and integrated optical components may be used to shape their radiation pattern. LEDs present many advantages over flourescent light sources including lower energy consumption, longer lifetime, improved robustness, smaller size, and faster switching. Efficient lighting is needed for sustainable architecture. A typical 13 watt LED lamp can emit 450 to 650 Lumens which is equivalent to a standard 40 watt incandescent bulb. LEDs have become more efficient, so that a 6 Watt LED can easily achieve the same results. The lifetime of a flourescent lamp depends on many factors, including operating voltage, manufacturing defects, exposure to voltage spikes, mechanical shock, frequency of cycling on and off, lamp orientation, and ambient operating temperature, among other factors. Typically, the lifetime is 6,000-10,000 hours. The life of a flourescent lamp is significantly shorter if it is turned on and off frequently, as is the case in residential and some commercial applications. LEDs, on the other hand, have a lifetime of 50,000 hours.

LED based lighting could be a cost-effective option for lighting a home or office space because of their very long lifetimes. Consumer use of LEDs as a replacement for conventional lighting system have been hampered in the past by the high cost and low efficiency of available products. However, there are LEDs available as efficient as 150 lm/W and even inexpensive low-end models typically exceed 50 lm/W, but are not available as drop-in replacements for flourescent lamps.

SUMMARY OF THE INVENTION

What is provided is a method and corresponding apparatus that enables a drop-in replacement for flourescent tubes any place they are used. Stated differently, a consumer may purchase such an LED based assembly as provided below to directly replace, without the need for any additional assembly, installation, or de-installation of any supporting electrical systems, the LED based light apparatus as provided below as they would a normal flourescent tube. The assembly provides standard connectors such that the mounting of the assembly is transparent to the user with respect to a standard flourescent tube.

In a first aspect of the invention, a method of forming a lighting assembly comprises mounting at least one LED onto a substrate, mounting a heat sink layer on the substrate, and mounting the substrate in a structural frame. Preferably, the method also includes mounting a light filter layer on the substrate, mounting a light diffusion layer on the substrate, such that the at least one LED is oriented to emit light through the light filter layer and diffusion layer. In some embodiments, the at least one LED is a part of an array of LEDs. The LEDs can be mounted in flip chip fashion, such that an active area of the LED emitting light is oriented toward an aperture in the substrate such that light can pass through the aperture, light filter layer and diffusion layer. Alternatively, the LEDs can be mounted in standard orientation with wirebonds such that light is emitted away from the substrate. Preferably, a heat sink is mounted. The heat sink can be an optically transparent layer mounted in the path of the light emitted by the LED or alternatively can be mounted to the back of the LED if they have been mounted in a flip chip fashion. The method further includes mounting a set of connectors, such as bi-pin connectors, on the substrate. Alternatively, the connectors can be mounted on a structural frame supporting the substrate. In some embodiments, at least one set of second connectors is mounted on the structural frame configured to mate with the first connectors on the substrate. These second connectors can be standard bi-pin connectors used commonly to connect flourescent lamps. The second connectors can be replaceable for allowing different form factors, sizes and standards. Also, a voltage controller such as a choke coil can be mounted onto the substrate for absorbing voltage spikes, transients, or other electrical anomalies. A microcontroller can be mounted for control of any electrical functions such as brightness or dimness, duration of operation, enabling a remote control function, or the like. A microcontroller is highly adaptable and flexible and can be used to implement a wide array of application specific requirements.

In another aspect of the invention, an LED lighting array comprises a substrate, an LED array mounted on the substrate, a heat sink mounted to the substrate, an ultraviolet filter mounted to the substrate, and a light diffusion layer mounted to the substrate. Preferably, the LED array is positioned to emit light through the ultraviolet filter and light diffusion layer. The heat sink is preferably optically transparent, and the LED array is positioned to emit light through the optically transparent heat sink. Alternatively, a standard fin-type heat sink, actively liquid or air cooled heat sink, or the like can be mounted on a non-light emitting surface thermally coupled to the LED array. The heat sink should be constructed of a thermally conductive and electrically insulative material. In some embodiments, a voltage controller is included for absorbing transient voltage spikes from a power source or a ballast. The voltage controller can be an active circuit such as a buck/boost converter, or switching converter, or a passive element such as a transformer, inductor, choke coil, or any other known or application specific assembly for rejecting transients in a power supply. A microcontroller is included for accepting control signals. Control signals can include any user controllable feature of light, such as dimness, brightness, time of operation, remote control, memory features, or the like. The LED lighting array is preferably equipped with standard bi-pin connectors. Since bi-pin connectors are available in standard sizes, the bi-pin connectors of the embodiments herein preferably have replaceable or changeable connectors so that the LED light array can be used with any size receptacle. Furthermore, changeable connectors allow for connectors of any form factor to be used. The LED lighting array is mounted on a structural support. The structural support can be planar and accommodate a plurality of LED lighting arrays thereon, or can be cylindrical to closely resemble the form factor that users of flourescent lamps are accustomed to. In some embodiments, the structural support includes a sliding member for adjusting a length of the structural frame to enable the LED lighting array to be used in any size lighting fixture already configured to accept a flourescent tube.

DETAILED DESCRIPTION OF THE INVENTION

In the following description, numerous details are set forth for purposes of explanation. However, one of ordinary skill in the art will realize that the invention can be practiced without the use of these specific details. Thus, the present invention is not intended to be limited to the embodiments shown but is to be accorded the widest scope consistent with the principles and features described herein or with equivalent alternatives. For example, elements of the several embodiments shown in the drawings and supported by the specification are interchangeable among the other embodiments. Orientations and arrangements of the several elements can be altered for application specific requirements. Elements may be left out. The person of ordinary skill having the benefit of this disclosure will readily appreciate that several embodiments are attainable by combinations of the several elements described in the specification and shown in the figures.

Reference will now be made in detail to implementations of the present invention as illustrated in the accompanying drawings. The same reference indicators will be used throughout the drawings and the following detailed description to refer to the same or like parts. Embodiments of the present invention are directed to an apparatus for and methods of single substrate semiconductor carriers or packages. The term "LED lighting array" refers generally to a plurality of individual LEDs that are fabricated of the same monolithic semiconductor substrate, or alternatively a plurality of packaged LEDs mounted together, or a combination of such structural arrangements. Bi-pin connectors are referenced herein for brevity and clarity since bi-pin connectors are the standard connectors and corresponding sockets for flourescent lamps. It is understood that the connectors can be replaced with any standard or application specific connector or receptacle as required.

Figure 1A:
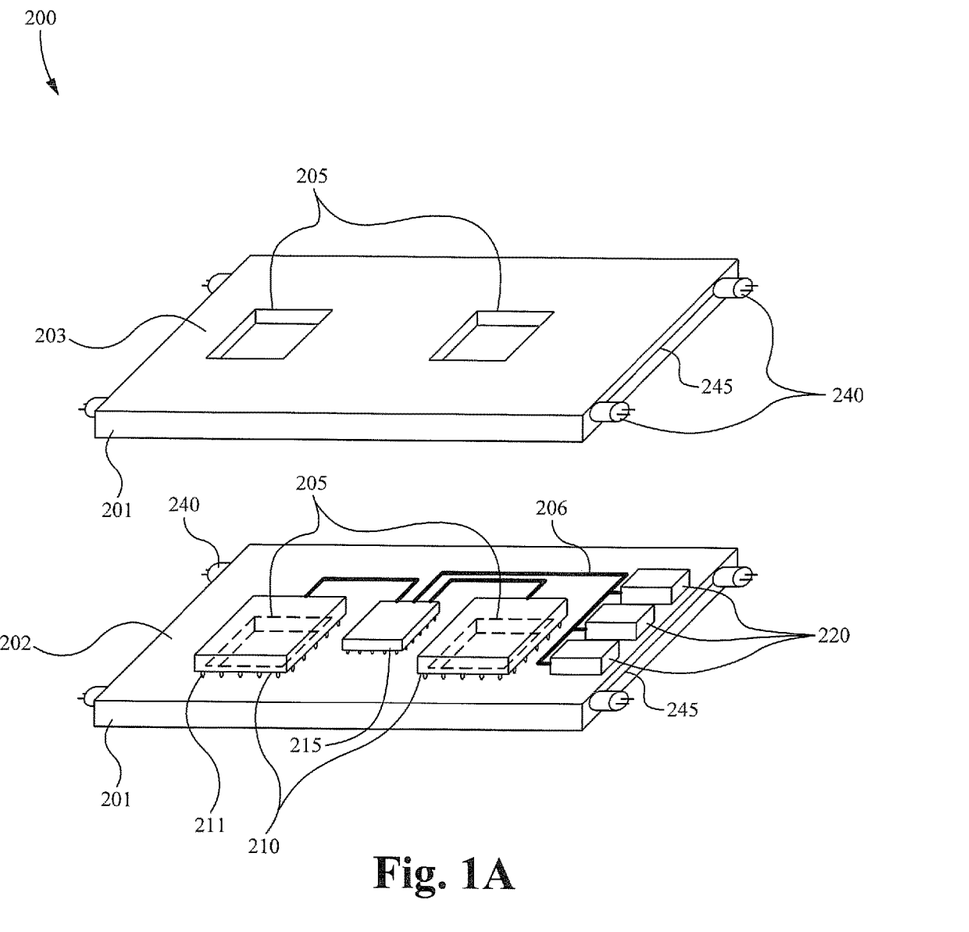
FIG. 1A shows an LED lighting array per an embodiment of the current invention.
Figure 1B:
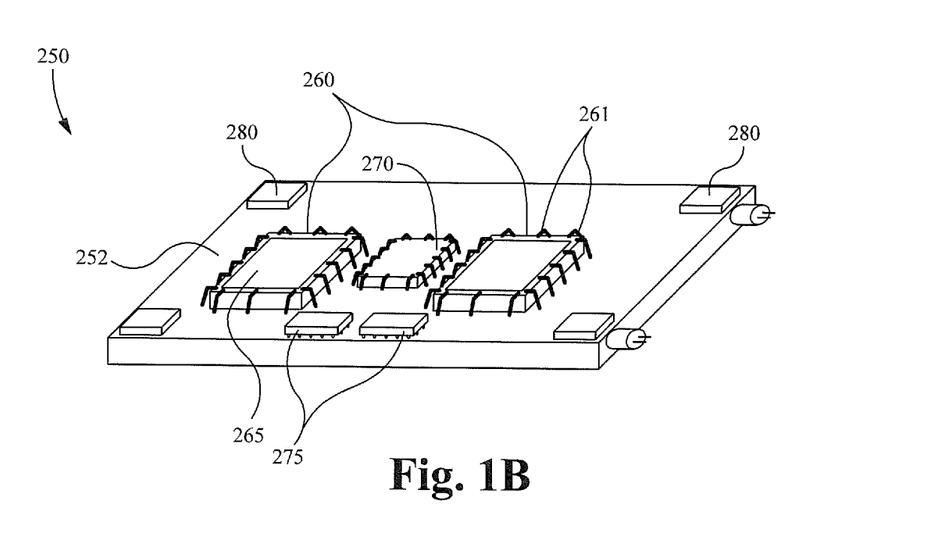
FIG. 1B shows an LED lighting array per an embodiment of the current invention.

FIGS. 1A and 1B show embodiments of a planar LED lighting array configured and arranged for plug-and-play replacement of standard flourescent lights. FIG. 1A shows a first exemplary embodiment of an LED lighting array 200. First, a support structure 201 is shown from a bottom surface 203. The bottom surface 203 is referred to as such in this exemplary embodiment because in a standard lighting fixture, the bottom surface 203 will be facing downwards from a ceiling. The bottom surface 203 can alternatively be known as the emitting surface, since light is emitted away from that surface as will be made clear in the description below. The support structure 201 has at least one aperture 205. In the example of FIG. 1A, two apertures 205 are provided. The support structure 205 can be constructed of any convenient printed circuit board (PCB) material, such as FR4 laminate, that is amenable to forming circuit traces thereon. The apertures 205 are arranged and spaced for optimum illumination from LEDs that are mounted on an opposite side (explained below). The apertures 205 can be of any corresponding size or shape according to the particular LEDs used in any given application. The support structure 201 comprises connectors 240. In the example of FIG. 1A, the connectors 240 are standard bi-pin connectors widely used for mounting of flourescent lamps into appropriate receptacles. Preferably, the connectors 240 are removable and exchangeable to enable the LED lighting array 200 to mate with any particular, known or applications specific receptacle. In the example of FIG. 1A, the support structure 201 has four connectors 240. The four connectors 240 correspond to two flourescent lamps, as it is well known that each flourescent lamp has a connector on each end. The exemplary embodiment of FIG. 1A is able to fit into a lighting fixture previously configured to receive two flourescent bulbs. The person of ordinary skill having the benefit of this disclosure will readily appreciate that any number of connectors 240 can be included for replacing any number of flourescent bulbs in a particular fixture. The connectors 240 can be electrically coupled to the circuit blocks 220, microcontroller 215 or LEDs 210 by circuit traces between laminate layers (not shown) of the support structure 201. In some embodiments, a rail 245 is provided to enable the connectors 240 to slide laterally. Advantageously, an LED lighting array 200 can be end user configured to fit into a particular lighting fixture.

The bottom figure in FIG. 1A shows the LED lighting array 200 from a top side 202. Again, a top side 202 is referred to since in most configurations, this is the surface that will be facing upward and away from the direction that light is emitted. The top surface 202 has circuit traces 206 patterned or otherwise formed thereon for enabling electrical communication between the several elements. Circuit blocks 220 can comprise voltage controllers, dimmers, remote control sensors, or the like. Remote control sensors can include infra red (IR) interfaces, radio interfaces, Bluetooth interfaces, or an application specific or proprietary interface. Circuit blocks 220 can be in communication with alarm systems. For example, an alarm tripped as a result of fire in a different area of a building can cause the LED lighting array 200 to display a particular pre-determined warning pattern of light. Specifically regarding voltage controllers, a voltage controller is included to reject voltage or current transients from a ballast generally coupled to power sources. Since the LED lighting array 200 is intended to be a drop-in replacement for flourescent bulbs, the existence of a ballast in the lighting fixture is assumed. Since a ballast is configured to provide a spike in current to a flourescent lamp or bulb, the spike should be accounted for. To that end, a voltage controller is provided. The voltage controller can be a simple choke coil or a low pass filter. Alternatively, the voltage controller can be an active device such as a buck/boost converter, power supply, or any combination of the above listed. In the example of FIG. 1A, two LEDs 210 are shown. The LEDs 210 are mounted in a flip chip fashion via solder balls 211 over the apertures 205. The active surface of the LEDs 210 where light is generated is preferably oriented directly above the apertures 205. The LEDs 210 can be any fabricated of any semiconductor material, including but not limited to Silicon, SiGe, CIGS, or the like and can be selected based upon cost, the amount of light and quality of light required for a particular application, color, heat generation, or any other factor. Also, a microcontroller 215 is provided to accept controls from an external source, memory or remote control. The microcontroller 215 is in electrical communication with the circuit blocks 220 and the LEDs 210. The microcontroller 215 can, for example, accept a dimming or brightening control from a user. Alternatively, the microcontroller 215 comprises memory or is coupled to external memory (not shown) having instructions thereon. The microcontroller 215 can be programmed to prepare for known current spikes from a ballast and appropriately control the voltage controller.

FIG. 1B shows another implementation of an LED lighting array 250. In the example of FIG. 1B, the LEDs 260 are facing away from the bottom surface 252 since the LEDs are mounted in a traditional wirebounded technique. Therefore, the light emitting active surface 265 of the LEDs 260 are facing away from the surface 252. A microcontroller 270 is also wirebonded. Circuitry 275, including a voltage controller, is shown mounted in flip chip configuration. In embodiments such as the example of FIG. 1B, it can be advantageous to include spacers 280 for mounting of layeres as will be explained below. The spacers 280 can be silicon or polyimide FR4 material.

Figure 2:
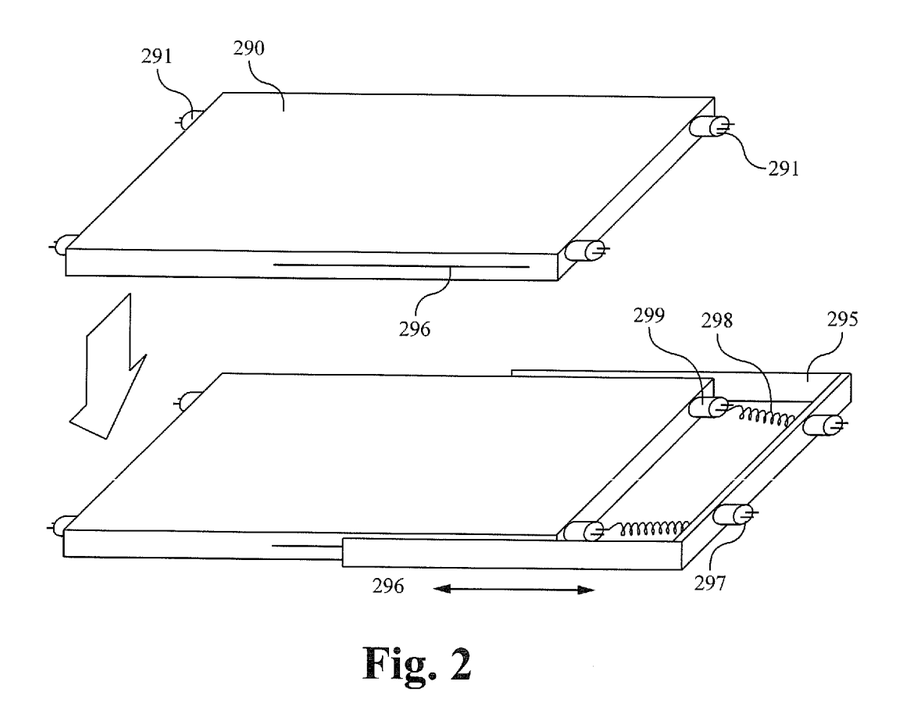
FIG. 2 shows an LED lighting array having a sliding member for size configuration.

Standard flourescent lamps come in a variety of lengths and as a result a flourescent lighting fixtures come in a variety of sizes. It would be advantageous if an LED lighting array, such as the ones described above, included a means for adjusting a length. To that end, FIG. 2 shows an LED lighting array 290 having a rail 296 for receiving a sliding member 295. For clarity, the elements described above are not included in FIG. 1C. The sliding member 295 allows a user to configure the overall length of the LED lighting array 290. Advantageously, the LED lighting array 290 can be configured to fit in any length lighting fixture. Flourescent lamps come in a variety of standard lengths. To that end, the rail 296 can include latching points at pre-defined points along the path of the rail 296 for latching the sliding member 295 in place. The sliding member 295 comprises a second set of connectors 297 that are coupled to a first set of connectors 299 via a flexible cable 298. Alternatively, the flexible cable 298 can be mounted directly to the LED lighting array 290.

Figure 3:
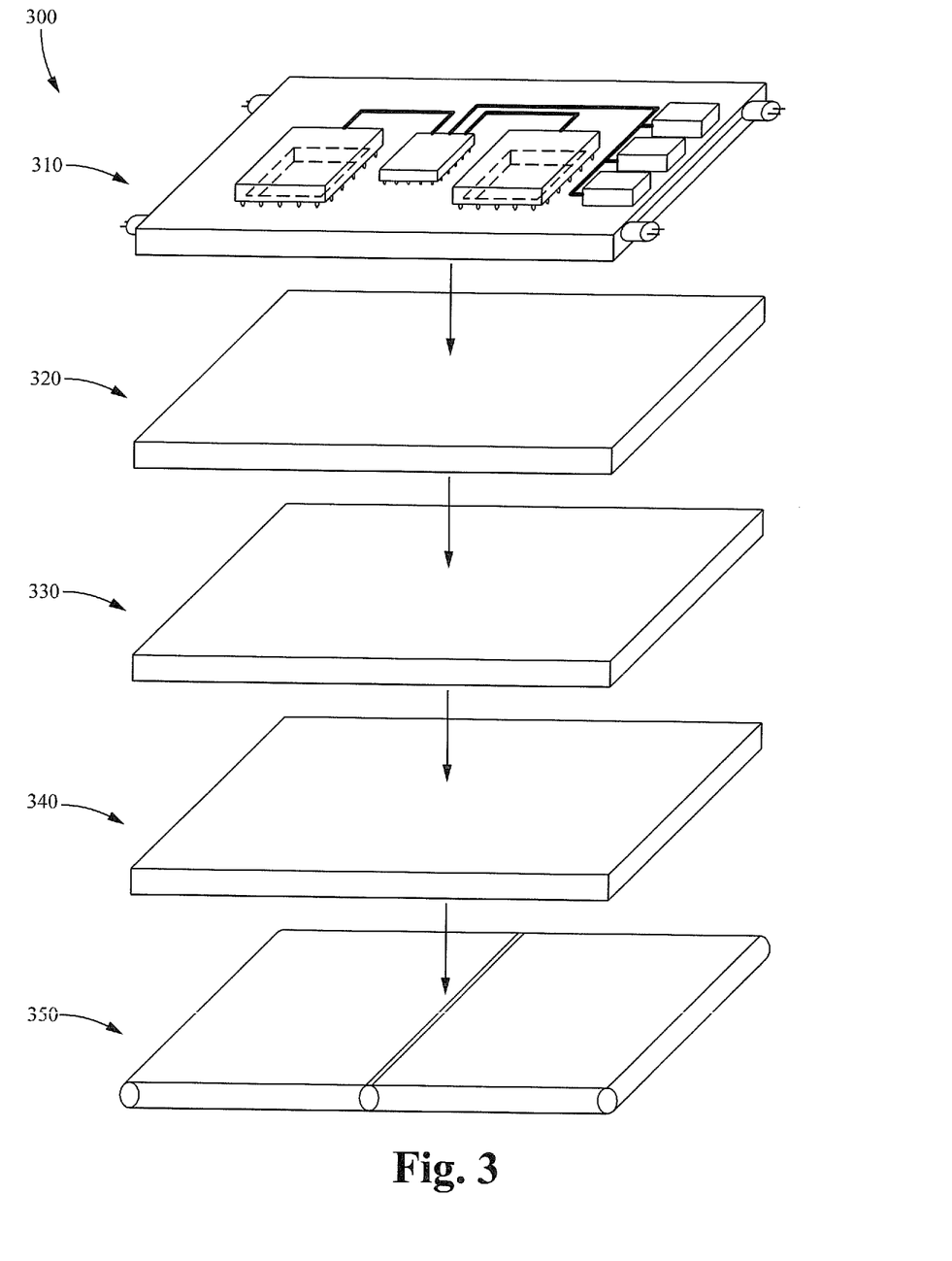
FIG. 3 shows exemplary assembly steps in the formation of an LED lighting array.

FIG. 3 shows assembly steps for adding layers and heat sinking to the LED lighting array 300. In a first step, the LED lighting array 310 of FIG. 1A is provided. In the example of FIG. 3, layers and heat sinks are mounted according to an embodiment wherein LEDs are mounted flip chip style and light is emitted through an aperture. Elements that are mounted in the steps below are mounted to the bottom surface 203. An optically transparent heat sink layer 320 is mounted. It is well known that LEDs generate heat. Furthermore, control electronics such as the microcontroller or voltage controller can also generate heat. To that end, the heat sink layer 320 is provided to radiate excess heat. Preferably, the heat sink material is an electrically insulative and thermally conductive material such as glass, ceramic or crystal. Alternatively, a polyimide or silicon based material can be used. Still alternatively, the heat sink layer 320 can be mounted on a top surface 202 (FIG. 1A) of the LED lighting array. Since such an arrangement would not impede light, the heat sink layer 320 can be of any material, and include heat fins for less thermal resistance. Then, a color/UV filter layer 330 is included. It is well known that LEDs that produce white or yellow light can be expensive or inefficient. To that end. A color/UV filter is included so that more common and easily manufactured semiconductor substrates can be used to fabricate the LEDs. The color/UV filter can also be incorporated into the apertures 205 of FIG. 1A. A light diffusion layer 340 is then mounted. The light diffusion layer 340 diffuses or spreads out or scatters light to give soft light. Diffused light can be easily obtained by making light to reflect diffusely from a white surface, such as the use of a phosphorus coating. Alternatively, the light diffusion layers may use translucent materials including ground glass diffusers, teflon diffusers, holographic diffusers, opal glass diffusers, and greyed glass diffusers. In a next step, a structural frame 350 is incorporated. The structural frame 350 can be adjustable in length and width for accommodating any size lighting fixture. The structural frame 350 can be integrally formed into the support substrate 201 of FIG. 1A and slide along a rail such as 296 of FIG. 1C. Still alternatively, the bi-pin connectors 240 of FIG. 1A can be mounted to the structural frame 350 rather than the support substrate 201.

Figure 4:
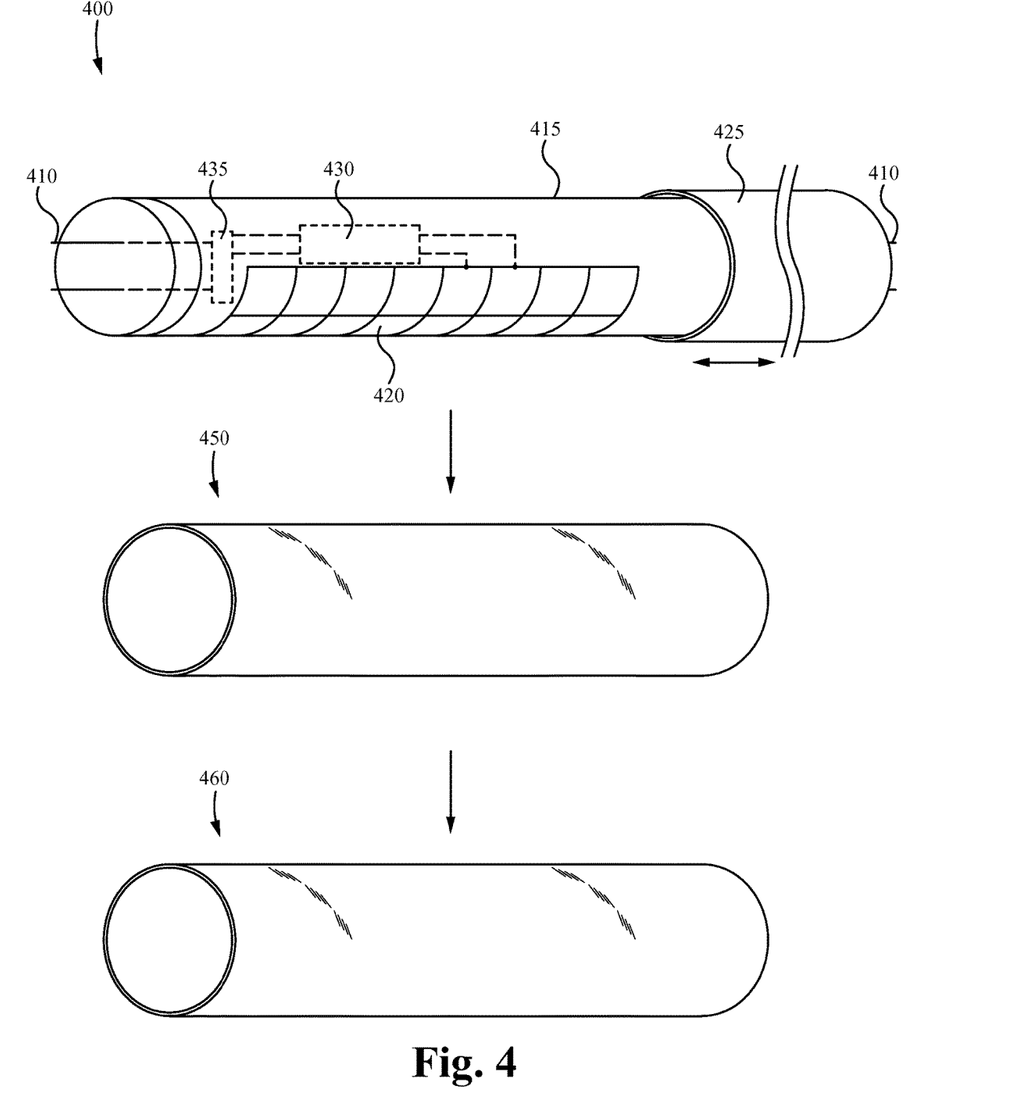
FIG. 4 shows an LED lighting array in a cylindrical form factor.

FIG. 4 shows an alternative embodiment of an LED lighting array 400. In the example of FIG. 4, the LED lighting array 400 comprises a cylindrical housing 415. Advantageously, the form factor of the cylindrical housing 415 gives an end user familiarity with respect to well known flourescent lamps and allows the end user to freely swap the LED lighting array 400 for a flourescent lamp. The LED lighting array 400 comprises bi-pin connectors on both ends similar to a standard flourescent lamp. The bi-pin connectors 410 on at least one side are coupled to a voltage controller 435. The voltage controller 435 regulates power provided by a socket (not shown) and to squelch transients and power spikes whether purposefully provided by a power source or cause by a malfunction. Most flourescent lighting systems allow for an initial spike in current to begin to warm up the gasses within the flourescent lamps. With an LED array, such a spike is unnecessary and can cause harm to the array or other electronics within. To that end, the voltage controller 435 suppresses or squelches such transients. The voltage controller 435 can be a passive device such as a transformer, a choke coil, or an active power converter such as a buck/boost or other switching converter, or any combination thereof. The voltage controller 435 also provides power to a microcontroller 430. The microcontroller 430 can be a processor, a PIC controller, an FPGA, or any other convenient or application specific controller. The microcontroller 430 can have on board memory for storing pre-determined lighting requirements, such as brightness vs. time of day, or the microcontroller 430 can be configured to accept remote control signals for controlling any aspect of the light provided, such as brightness. The microcontroller 430 is shown coupled to several LEDs 420. The LEDs 420 can be a grid formation of individual LEDs, or an array of LEDs formed on an individual substrate, or any combination thereof. The LEDs 420 can be of any silicon substrate. However, it is well known that different substrates generate different wavelengths of light. To that end, a diffusion layer 450 is provided. The diffusion layer 450 is preferably a translucent layer adapted to fit over the LEDs 420. In some embodiments, the diffusion layer can be integral to the housing 415. Alternatively, different diffusion layeres 415 can be provided to provide different colors of light. Also, a heat sink layer 460 is provided. The heat sink layer 460 is also a translucent layer of thermally conductive and electrically insulative material including but not limited to ceramics, glass, silicon, polymers, or any other known of application specific material for permitting light to permeate through while sinking waste heat. In some embodiments, a sliding body 425 is provided to adjust a length of the LED lighting array 400. The sliding body 425 can be slidably coupled by a spring, a rail, or the like and can be configured to latch into positions corresponding to standard lengths of flourescent lamps.

Although flourescent lamps are described herein, the person of ordinary skill having the benefit of this disclosure will readily appreciate that the invention described herein can be applied to numerous form factors. For example, a screw in replacement for light bulbs is contemplated. Control electronics, LEDs, a UV filter, diffusion layer, and heat sink can be included in a form factor having a standard light bulb screw connector. While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

What is claimed is:

1. An LED lighting array comprising:
   a. a substrate;
   b. an LED array mounted on the substrate;
   c. a heat sink mounted to the substrate;
   d. an ultraviolet filter mounted to the substrate;
   e. a light diffusion layer mounted to the substrate; and
   f a structural frame having a sliding member including a set of bi-pin connectors, wherein the sliding member is slidably coupled with the substrate along a fixed path such that the sliding member is able to slide along the fixed path with respect to the substrate while still being coupled to the substrate;
   wherein the LED array is positioned to emit light through the ultraviolet filter and light diffusion layer, wherein the sliding member includes two parallel sides and third side coupled to ends of the two parallel sides forming a "U" shape, wherein an end of the substrate is configured to fit in the sliding member.

2. The LED lighting array of claim 1, wherein the heat sink is optically transparent, and the LED array is positioned to emit light through the optically transparent heat sink.

3. The LED lighting array of claim 1, wherein the heat sink comprises a thermally conductive and electrically insulative material.

4. The LED lighting array of claim 1, further comprising a voltage controller configured to prevent transient voltage spikes from a power source from reaching the LED array.

5. The LED lighting array of claim 1, further comprising a microcontroller for accepting control signals for control of light generated by the LED array, wherein the control signals are distinct from power signals that provide power to the LED array.

6. The LED lighting array of claim 1, wherein the structural frame is cylindrical in shape.

7. A lighting device for replacing standard flourescent lamps comprising:
   a. a substrate having at least one aperture thereon, wherein the aperture defines an open space that extends through the substrate;
   b. at least one LED, the LED having a light emitting surface, mounted to the substrate in a flip chip fashion such that light is emitted through the aperture;
   c. a light diffusion layer coupled to the substrate such that the light emitting surface of the LED passes through;
   d. a UV filter layer coupled to the substrate such that the light emitting surface of the LED passes through;
   e. an optically transparent heat sink layer coupled to the substrate such that the light emitting surface of the LED passes through; and
   f. a sliding member slidably coupled with the substrate, wherein the sliding member includes two parallel sides and third side coupled to ends of the two parallel sides forming a "U" shape, wherein an end of the substrate is configured to fit in the sliding member.

8. The lighting device of claim 7, wherein a perimeter of the at least one aperture matches a perimeter of the at least one LED.

9. The lighting device of claim 8, wherein an active area of the at least one LED faces the at least one aperture, wherein the at least one LED is mounted to the substrate by conductive bumps.

10. The lighting device of claim 9, wherein the UV filter layer is incorporated into the at least one aperture of the substrate.

11. An LED lighting array comprising:
   a. a substrate including rails along surfaces of the substrate;
   b. an LED array mounted on the substrate;
   c. a heat sink mounted to the substrate;
   d. an ultraviolet filter mounted to the substrate;
   e. a light diffusion layer mounted to the substrate; and f a structural frame having a sliding member including a set of bi-pin connectors, wherein the sliding member is slidably coupled with the substrate via the rails such that the sliding member is able to slide with respect to the substrate while still being coupled to the substrate, wherein the overall length of the LED lighting array is greater when the structural frame is at first location on the rails than at a second location on the rails;

wherein the LED array is positioned to emit light through the ultraviolet filter and light diffusion layer, wherein the sliding member includes two parallel sides and third side coupled to ends of the two parallel sides forming a "U" shape, wherein an end of the substrate is configured to fit in the sliding member.

12. The LED lighting array of claim 11, further comprising on-substrate connectors located at the end of the substrate.

13. The LED lighting array of claim 11, wherein the set of bi-pin connectors at the third side, wherein the set of bi-pin connectors are electrically coupled with the on-substrate connectors.

14. The LED lighting array of claim 11, further comprising a plurality of circuit blocks that is in communication with remote control sensors.

15. An LED lighting array comprising:

a. a substrate including rails along surfaces of the substrate;

b. an LED array mounted on the substrate;

c. a heat sink mounted to the substrate;

d. an ultraviolet filter mounted to the substrate;

e. a light diffusion layer mounted to the substrate; and f a structural frame having a sliding member including a set of bi-pin connectors, wherein the sliding member is slidably coupled with the substrate via the rails such that the sliding member is able to slide with respect to the substrate while still being coupled to the substrate, wherein the overall length of the LED lighting array is greater when the structural frame is at first location on the rails than at a second location on the rails;

wherein the LED array is positioned to emit light through the ultraviolet filter and light diffusion layer, wherein when an alarm is tripped by remote control sensors that are alarms systems, the LED array is configured to display a pre-determined warning pattern of light.

* * * * *